US012575200B2

(12) United States Patent
Yang

(10) Patent No.: US 12,575,200 B2
(45) Date of Patent: Mar. 10, 2026

(54) TIME-OF-FLIGHT DISTANCE MEASURING SYSTEM WITH PIXELS INCLUDING A LIGHT SENSOR AND AN OVERLYING PIN DIODE TO INCREASE THE SPEED OF DETECTION

(71) Applicant: SHENZHEN GOODIX TECHNOLOGY CO., LTD., Guangdong (CN)

(72) Inventor: Meng-Ta Yang, Guangdong (CN)

(73) Assignee: SHENZHEN GOODIX TECHNOLOGY CO., LTD., Guangdong (CN)

( * ) Notice: Subject to any disclaimer, the term of this patent is extended or adjusted under 35 U.S.C. 154(b) by 1146 days.

(21) Appl. No.: 17/465,393

(22) Filed: Sep. 2, 2021

(65) Prior Publication Data

US 2021/0399027 A1 Dec. 23, 2021

Related U.S. Application Data

(63) Continuation of application No. PCT/CN2020/079648, filed on Mar. 17, 2020.

(51) Int. Cl.
| | |
|---|---|
| *H10F 39/00* | (2025.01) |
| *G01S 7/481* | (2006.01) |
| *G01S 17/10* | (2020.01) |

(52) U.S. Cl.
CPC ........ *H10F 39/8033* (2025.01); *G01S 7/4816* (2013.01); *G01S 17/10* (2013.01)

(58) Field of Classification Search
CPC ............. H10F 39/8033; H10F 39/8037; H10F 39/8023; H10F 39/809; G01S 7/4816; G01S 17/10; G01S 7/4863
See application file for complete search history.

(56) References Cited

U.S. PATENT DOCUMENTS

| | | | | |
|---|---|---|---|---|
| 2011/0037969 A1* | 2/2011 | Spickermann | .......... | G01S 17/10 |
| | | | | 356/5.01 |
| 2012/0205723 A1* | 8/2012 | Suzuki | .................. | H10F 39/803 |
| | | | | 257/215 |

(Continued)

FOREIGN PATENT DOCUMENTS

| | | |
|---|---|---|
| CN | 101211950 A | 7/2008 |
| CN | 102324430 A | 1/2012 |

(Continued)

OTHER PUBLICATIONS

CN 103311260 A translation (Year: 2013).*

(Continued)

*Primary Examiner* — William B Partridge
*Assistant Examiner* — Ilker Ozden
(74) *Attorney, Agent, or Firm* — WPAT, P.C.; Anthony King

(57) ABSTRACT

This application discloses a light sensor and a related time-of-flight distance measuring system. The light sensor includes a semiconductor substrate, having a first surface and a second surface; a photodiode, disposed in the semiconductor substrate and adjacent to the first surface, wherein the photodiode is configured to sense light to generate charges; a first floating diffusion region, disposed in the semiconductor substrate and adjacent to the first surface, and configured to collect charges during a sampling operation; a gate, disposed on the semiconductor substrate, and configured to selectively control the charges to enter the first floating diffusion region; and PIN diode, disposed on the photodiode, wherein the PIN diode at least partially overlaps with the photodiode, when viewed from a top view.

14 Claims, 7 Drawing Sheets

(56) References Cited

U.S. PATENT DOCUMENTS

| 2013/0248938 | A1* | 9/2013 | Buettgen | H10F 71/121 |
| | | | | 257/229 |
| 2015/0008493 | A1 | 1/2015 | Ni | |

FOREIGN PATENT DOCUMENTS

| CN | 102376728 | A | | 3/2012 |
| CN | 103311260 | A | * | 9/2013 |
| CN | 103491323 | A | * | 1/2014 |
| CN | 104303304 | A | | 1/2015 |
| CN | 104835825 | A | | 8/2015 |
| EP | 3610510 | B1 | | 7/2021 |
| WO | 2011157726 | A1 | | 12/2011 |

OTHER PUBLICATIONS

CN 103491323 A translation (Year: 2014).*
A. Spickermann et al., "CMOS 3D image sensor based on pulse modulated time-of-flight principle and intrinsic lateral drift-field photodiode pixels," 2011 Proceedings of the ESSCIRC (ESSCIRC), Helsinki, Finland, 2011, pp. 111-114, doi: 10.1109/ESSCIRC.2011.6044927. (Year: 2011).*
Translation of CN103491323 (Gu-23) (Year: 2014).*
Translation of CN103311260A (Gu-60) (Year: 2013).*
CMOS 3D image sensor based on pulse modulated time-of-flight principle and intrinsic lateral drift-field photodiode pixels, 2011 Proceedings of the ESSCIRC (ESSCIRC), Helsinki, Finland, 2011, pp. 111-114, doi: 10.1109/ESSCIRC.2011.6044927 (Year: 2011 ).*
Translation of CN 103491323 A (Gu-23) (Year: 2013).*

English abstract translation of CN102376728A.
Spickermann, A., Durini, D., Suss, A., Ulfig, W., Brockherde, W., Hosticka, B. J., . . . Grabmaier, A. (2011). CMOS 3D image sensor based on pulse modulated time-of-flight principle and intrinsic lateral drift-field photodiode pixels. 2011 Proceedings of the ESSCIRC (ESSCIRC). doi: 10.1109/esscirc.2011.6044927.
Buttgen, B., Oggier, T., Kaufmann, R., Seitz, P., & Blanc, N. (2004). Demonstration of a novel drift field pixel structure for the demodulation of modulated light waves with application in three-dimensional image capture. Three-Dimensional Image Capture and Applications VI. doi:10.1117/12.525654.
English Abstract of CN103311260A.
English Abstract of CN104303304A.
English Abstract of CN103491323A.
English Abstract of CN102324430A.
English Abstract of CN104835825A.
As-filed PCT Request of PCT/CN2020/079648.
As-filed PCT Application of PCT/CN2020/079648.
International Searching Authority (ISA) Form 202—Notification of Receipt of Search PCT/CN2020/079648.
International Searching Authority (ISA) Form 210—International Search Report of PCT/CN2020/079648.
International Searching Authority (ISA) Form 220—Notification of Transmittal of the International Search Report and the Written Opinion of the International Searching Authority, or the Declaration of PCT/CN2020/079648.
International Searching Authority (ISA) Form 237—Written Opinion of PCT/CN2020/079648.
Notification of the International Application number and of the International Filing Date—Form 105 of PCT/CN2020/079648.
English abstract translation of CN101211950A.

* cited by examiner

204

300

300

300

400

100

TIME-OF-FLIGHT DISTANCE MEASURING SYSTEM WITH PIXELS INCLUDING A LIGHT SENSOR AND AN OVERLYING PIN DIODE TO INCREASE THE SPEED OF DETECTION

CROSS-REFERENCE TO RELATED APPLICATIONS

This application is a continuation of International Application No. PCT/CN2020/079648, filed on Mar. 17, 2020, the disclosure of which is hereby incorporated by reference in its entirety.

TECHNICAL FIELD

The present application relates to a light sensor, particularly a light sensor having a PIN diode and a related time-of-flight distance measuring system.

BACKGROUND

CMOS image sensors have been mass-produced and widely used. While conventional image sensors may generate two-dimensional (2D) images and video, recently, there has been much interest in image sensors and systems capable of generating three-dimensional (3D) images for applications such as face recognition, augmented reality (AR)/virtual reality (VR), drones, etc.

One of the existing 3D image sensors is based on the time-of-flight (TOF) distance measuring technique, in which the faster the sensor, the higher the accuracy, and therefore, how to improve the speed of the sensor is an urgent issue to be solved in the field.

SUMMARY OF THE INVENTION

One of the objectives of the present application is to disclose a light sensor and a related time-of-flight distance measuring system to solve the above-mentioned issue.

One embodiment of the present application discloses a light sensor, including a semiconductor substrate and a pixel array disposed on the substrate, wherein the pixel array includes a plurality of pixels, and the semiconductor substrate includes a first surface and a second surface opposite to the first surface, wherein each of the pixels includes: a photodiode, disposed in the semiconductor substrate and adjacent to the first surface, wherein the photodiode is configured to sense light to generate charges; a first floating diffusion region, disposed in the semiconductor substrate and adjacent to the first surface, and configured to collect the charges during a sampling operation; a first gate, disposed on the semiconductor substrate, and configured to selectively control the charges to enter the first floating diffusion region; and a PIN diode, disposed on the photodiode; wherein the photodiode has a first terminal and a second terminal, the first terminal faces the first floating diffusion region, and the second terminal faces away from to the first floating diffusion region; and the PIN diode at least partially overlaps with the photodiode as viewed from the first surface of the semiconductor substrate to the second surface, in a direction perpendicular to the first surface.

One embodiment of the present application discloses a time-of-flight distance measuring system, including: a light pulse generating unit, configured to generate a light pulse signal; and a light sensor described above, configured to receive the light pulse signal reflected from a target and generate a corresponding light sensing signal; and a processing unit, configured to calculate a distance between the system and the target based on the light-sensing signal.

The light sensor and the related time-of-flight distance measuring system disclosed in the present application uses a PIN diode to increase the speed that electrons move in the photodiodes of the pixels; in other words, the speed of the light sensor is increased, thereby improving the accuracy of the time-of-flight distance measuring system.

DETAILED DESCRIPTION

Figure 1:
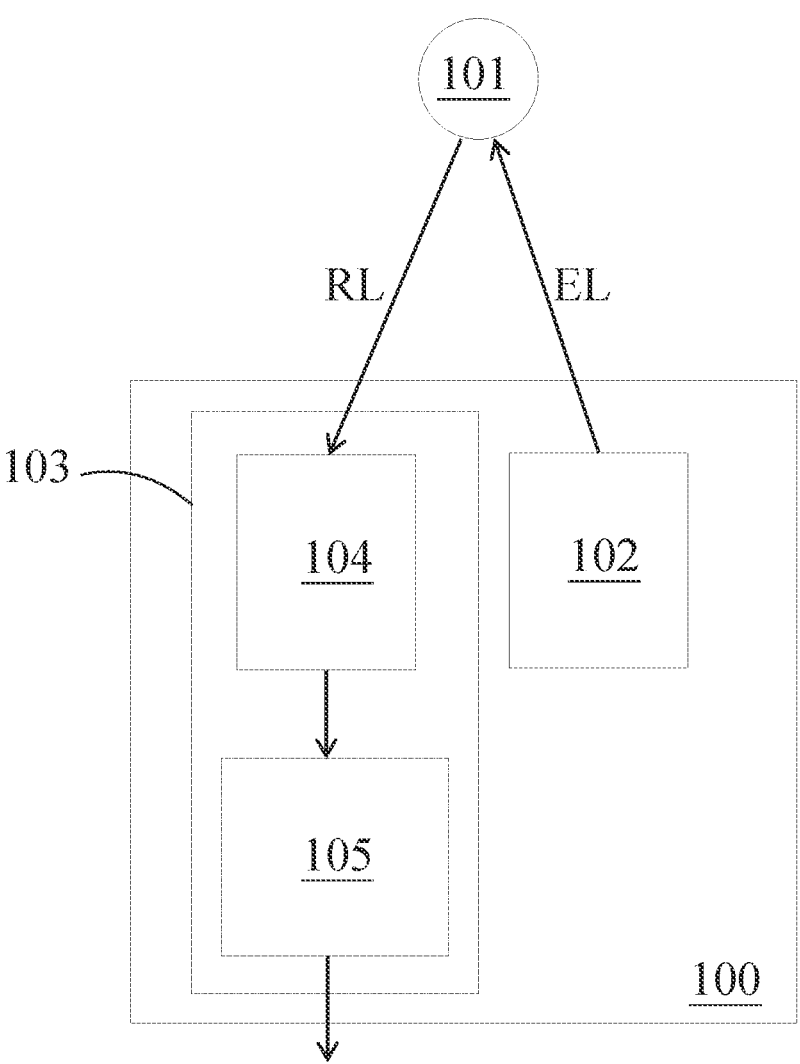
FIG. 1 is a functional block diagram illustrating a time-of-flight distance measuring system according to an embodiment of the present application.

FIG. 1 is a functional block diagram illustrating a time-of-flight (TOF) distance measuring system according to an embodiment of the present application. The TOF distance measuring system 100 is configured to detect the distance between a target 101 and the distance measuring system 100. It should be noted that the distance between the target 101 and the distance measuring system 100 should be less than or equal to the maximum measurable distance of the distance measuring system 100. For example (however, the present application is not limited thereto), the distance measuring system 100 could be a 3D imaging system, which may use the time-of-flight technique to measure the distance for surrounding targets, thereby obtaining the depth of field and 3D image information. In the present embodiment, the distance measuring system 100 may be implemented as a TOF-based optical distance measuring system.

The distance measuring system 100 may include (but is not limited to) a light pulse generating unit 102 and a light sensor 103. The light pulse generating unit 102 may be implemented using a light-emitting unit to generate a light pulse signal EL. The light pulse signal EL may include a plurality of light pulse. The light pulse generating unit 102 may be (but is not limited to) a laser diode (LD), a light-emitting diode (LED), or any other light-emitting unit capable of generating the light pulse. The light sensor 103 is configured to sense and sample a reflected signal RL generated by the target 101 when reflecting the light pulse signal EL so as to detect the distance between the distance measuring system 100 (or the TOF light sensor 103) and the target 101.

Figure 2:
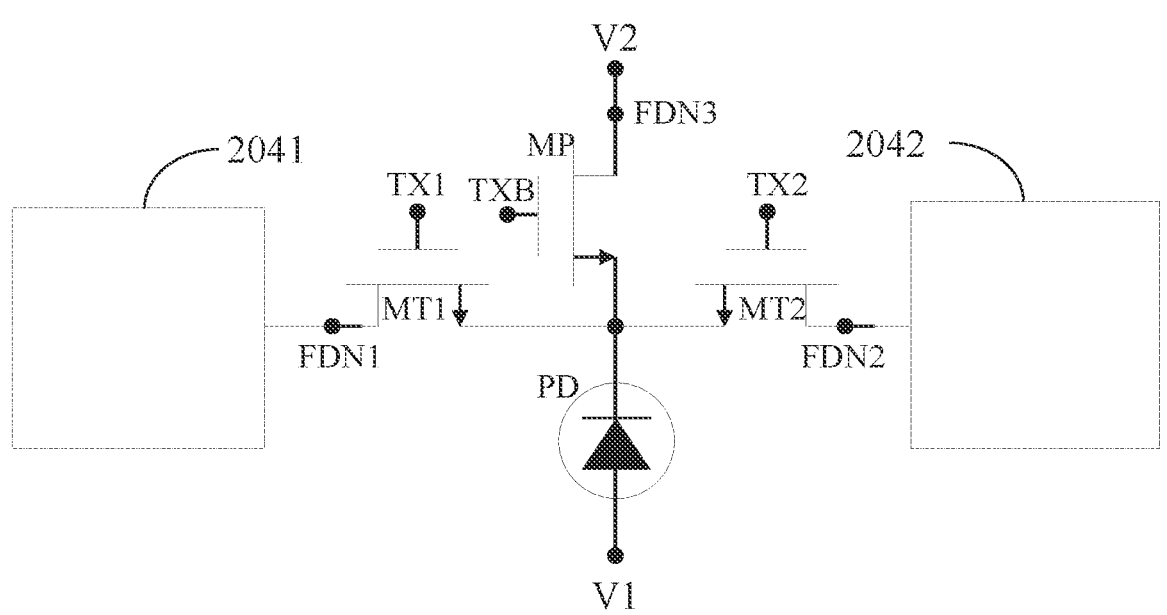
FIG. 2 is a schematic diagram illustrating an embodiment of a pixel of a pixel array.

The light sensor 103 includes (but is not limited to) a pixel array 104 and a readout circuit 105. The pixel array 104 includes a plurality of pixels (not shown in FIG. 1), and the readout circuit 105 is coupled to the pixel array 104 and configured to perform further processing to the sampling result of the pixel array 104. FIG. 2 is a schematic diagram illustrating a pixel of the pixel array 104 according to an embodiment of the present application. As shown in FIG. 2, the photodiode PD of the pixel 204 correspondingly generates charges according to the received reflected signal RL.

The switch MT1 of the pixel 204 is coupled between a first charge output circuit 2041 and the photodiode PD, wherein the switch MT1 is under the control of the first charge output signal TX1 to selectively couple the first charge output circuit 2041 to the photodiode PD, and when the first charge output signal TX1 controls the switch MT1 to be conducted, the charges of the photodiode PD flow into a floating diffusion region FDN1 of the first charge output circuit 2041, thereby generating a first sensed voltage through the first charge output circuit 2041. The switch MT2 of the pixel 204 is coupled between a second charge output circuit 2042 and the photodiode PD, wherein the switch MT2 is under the control of a second charge output signal TX2 to selectively couple the second charge output circuit 2042 to the photodiode PD, and when the second charge output signal TX2 controls the switch MT2 to be conducted, the charges of the photodiode PD flow into a floating diffusion region FDN2 of the second charge output circuit 2042, thereby generating a second sensed voltage through the second charge output circuit 2042. In this embodiment, the second charge output signal TX2 and the first charge output signal TX1 are conducted at a different time; for example, the second charge output signal TX2 and the first charge output signal TX1 have different phases. For instance, the phase difference between the second charge output signal TX2 and the first charge output signal TX1 is 180 degrees.

In the present embodiment, the pixel 204 may further include a reset transistor MP; however, the present application is not limited thereto. The reset transistor MP is coupled between the photodiode PD and a second voltage V2, and the reset transistor MP is configured to selectively reset the photodiode PD according to a reset signal TXB to reduce the effect of the accumulated charges generated by those other than the reflected signal RL on the sensed voltage, specifically, during the reset operation, the charges enter a third floating diffusion zone FDN3 so as to clear the charges on the photodiode PD.

In the present embodiment, all transistors are N-type transistors, and the second voltage V2 is greater than the first voltage V1. In other words, in the embodiment shown in FIG. 2, all transistors in the pixel 204 have the same polarity. However, the present application is not limited thereto, and in certain embodiments, transistors in the pixel 204 may all be P-type transistors, and the relative level of the first voltage V1 and second the voltage V2 may be adjusted correspondingly. In certain embodiments, the pixel 204 may have both-type transistors and P-type transistors.

Figure 3:
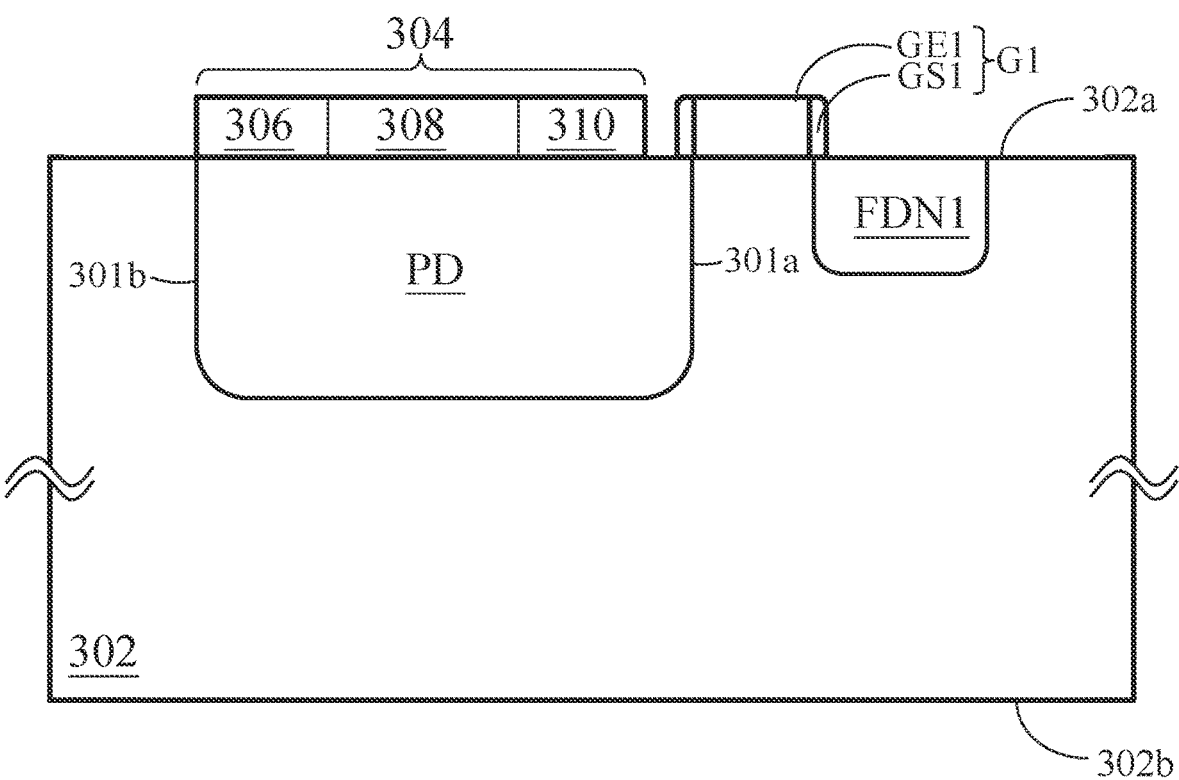
FIG. 3 is a cross-sectional diagram illustrating a light sensor of a pixel of the light sensor according to an embodiment of the present application.

FIG. 3 is a cross-sectional diagram illustrating a light sensor of the pixel 204 of the light sensor 103 according to an embodiment of the present application. The light sensor 300 shown in FIG. 3 only includes a portion of the pixel's 204 components. Specifically, the light sensor 300 includes a semiconductor substrate 302 having a first surface 302a and a second surface 302b, a photodiode PD disposed in the semiconductor substrate 302 and adjacent to the first surface 302a, wherein the photodiode PD senses light to generate charges. In this embodiment, the pixel's 204 light-receiving face may be the first surface or the second surface. In the present embodiment, the photodiode PD is lightly doped by N-type dopant and the overall N-type doping concentration in the photodiode PD, whether from left to right or from top to bottom, is uniform. The photodiode PD includes a first terminal 301a and a second terminal 301b, wherein both the first terminal 301a and the second terminal 301b are the interfaces between the photodiode PD and the semiconductor substrate 302, the first terminal 301a faces the first floating diffusion region FDN1, and the second terminal 301b faces away from the first floating diffusion region FDN1, and hence, the first terminal 301a is closer to the first floating diffusion region FDN1 than the second terminal 301b is; however, the first terminal 301a does not directly abut the first floating diffusion region FDN1; instead, the two are separated by the semiconductor substrate 302. That is, the N-type doping region of the PD does not directly contact the first floating diffusion region FDN1.

The floating diffusion region FDN1 is disposed in the semiconductor substrate 302 and is adjacent to the first surface 302a, and is configured to collect charges generated because the PD is irradiated by light during a sampling operation. The semiconductor substrate 302 further includes a gate G1 of the switch MT1, wherein the gate G1 is disposed on the first surface 302a of the semiconductor substrate 302 and configured to selectively control the charges to enter the first floating diffusion region FDN1 from the photodiode PD. The gate G1 includes an electrode GE1 and a side-wall spacer GS1, wherein the electrode GE1 is coupled to the first charge output signal TX1, and the electrode GE1 may include polysilicon heavily doped by N-type dopant. The gate G1 further includes a dielectric layer (such as insulating layers including oxides and the like, not shown in the drawings) disposed between the electrode GE1 and the first surface 302a of the semiconductor substrate 302.

The semiconductor substrate 302 further includes a diode 304 disposed on of the first surface 302a of the semiconductor substrate 302, such as a PIN diode. A dielectric layer (such as insulating layers including oxides and the like, not shown in the drawings) is disposed between the diode 304 and the first surface 302a of the semiconductor substrate 302. It should be noted that the diode 304 is not shown in the circuit diagram of FIG. 2. In the present embodiment, the diode 304 are made of polysilicon, wherein a portion of the polysilicon is subject to heavy N-type doping to form an N-type region 310, a portion of the polysilicon is subject to heavy P-type doping to form a P-type region 306, and the polysilicon between the polysilicon 310 and the polysilicon 306 that is not doped forms an intrinsic region 308, wherein N-type region 310 is closer to the first floating diffusion region FDN1 than the P-type region 306 is. In this embodiment, the CMOS manufacturing process is used to grow polysilicon on a substrate and then perform P-type doping and N-type doping from two sides, respectively, to obtain the diode 304, whereas the non-doped neutral region I in the middle has a certain thickness, which may reduce the occurrence of breakdown when the diode 304 is reverse-biased.

Figure 4:
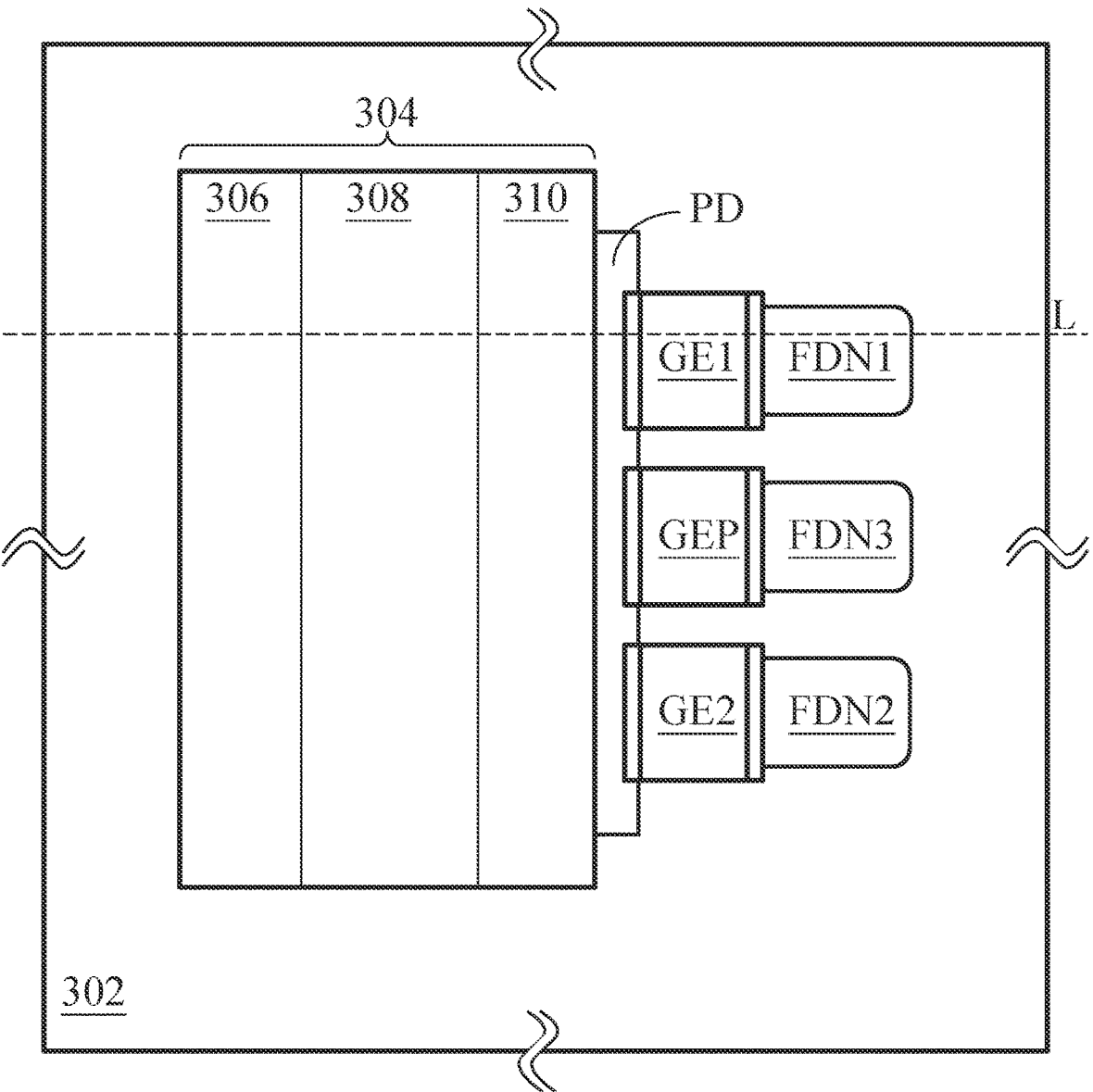
FIG. 4 is a top view diagram of the light sensor of FIG. 3.

FIG. 4 is a top view diagram of the light sensor shown in FIG. 3, wherein the cross-sectional diagram of the FIG. 3 is obtained along the cross-section line L shown in FIG. 4. The top view diagram of FIG. 4 includes a gate of the switch MT2 (including an electrode GE2), a second floating diffusion region FDN2, a gate of a reset transistor MP (including an electrode GEP), and a third floating diffusion region FDN3. The first floating diffusion region FDN1, the second floating diffusion region FDN2, and the third floating diffusion region FDN3 are all disposed at the same side of the photodiode PD; that is, the side adjacent to the first terminal 301a. The third floating diffusion region FDN3 is between the first floating diffusion region FDN1 and the second floating diffusion region FDN2, and the electrode GEP is between the electrode GE1 and the electrode GE2. Specifically, since the first floating diffusion region FDN1 and the second floating diffusion region FDN2 supply the charges that they obtain during the sampling operation to the first charge output circuit 2041 and the second charge output circuit 2042, respectively, it is preferred that the relative positions of the first floating diffusion region FDN1 and the second floating diffusion region FDN2 with respect to the photodiode PD are arranged symmetrically so that the charges from the photodiode PD to the first floating diffusion region FDN1 and the second floating diffusion region FDN2 have equal distances and electric field conditions.

Referring to both FIG. 3 and FIG. 4, the diode 304 at least partially overlaps with the photodiode PD, or put it another way, the projection of the diode 304 at least partially overlaps with the projection of the photodiode with respect to the first or second surface. In the present embodiment, the diode 304 extends from above the photodiode PD near the first end 301a toward the second end 301b, and the diode 304 overlaps with the second end 301b of the photodiode PD. In the specific embodiment as shown in FIG. 3 and FIG. 4, if the position relationship between the diode 304 and the photodiode PD is described according to their projections on the substrate, in simple terms, the diode 304 does not cover a portion of the region of the photodiode PD near the first end 301a, but it covers the other regions of the photodiode PD, including the second terminal 301b. The present application does not particularly limit the extent that the diode 304 overlaps with the photodiode PD; in certain embodiments, the diode 304 completely overlaps with the photodiode PD.

The diode 304 is coupled to a bias voltage, and during the operation of the TOF distance measuring system 100 (including the sampling operation and non-sampling operation), the diode 304 is reverse-biased by the bias voltage, i.e., the voltage of the N-type region 310 is higher than the voltage of the P-type region 306. Since the N-type region 310 is adjacent to the first terminal 301a, and the P-type region 306 is adjacent to the second terminal 301b, the diode 304 may affect the electric field in the photodiode PD so that the electrical potential of the first terminal 301a is higher than that of the second terminal 301b.

Figure 5:
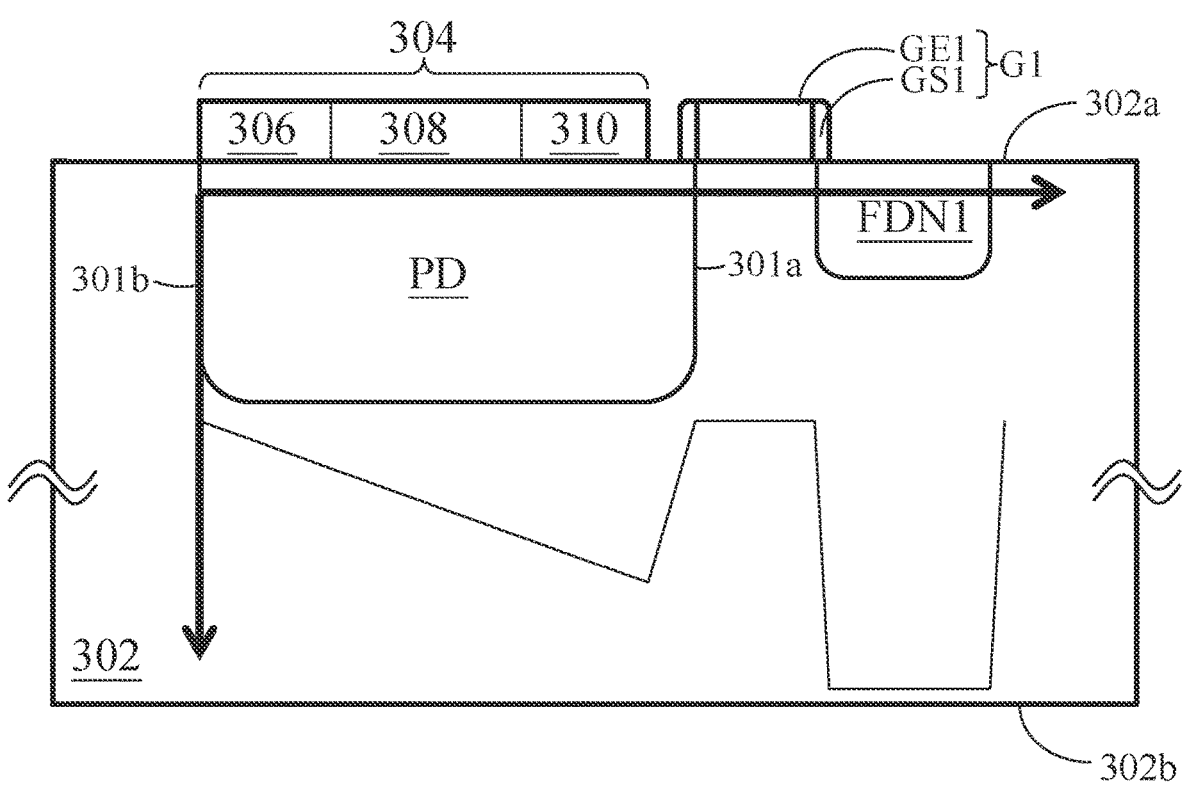
FIG. 5 is an electrical potential diagram of a light sensor when a time-of-flight distance measuring system does not operate under the sampling operation.

FIG. 5 is an electrical potential diagram of the light sensor 302 when the TOF distance measuring system 100 is not operating under a sampling operation. As shown in FIG. 5, the horizontal axis represents the position, and the vertical axis represents the electrical potential increasing downwardly). Since the photodiode PD is affected by the diode 304 to produce an electrical potential difference, which increases from the second terminal 301b to the first terminal 301a, the charge will move to the first terminal 301a, but because the switch MT1 has not been conducted at this time (that is, the first charge output signal TX1 is at low voltage), the charge cannot flow from the photodiode PD into the first floating diffusion region FDN1.

Figure 6:
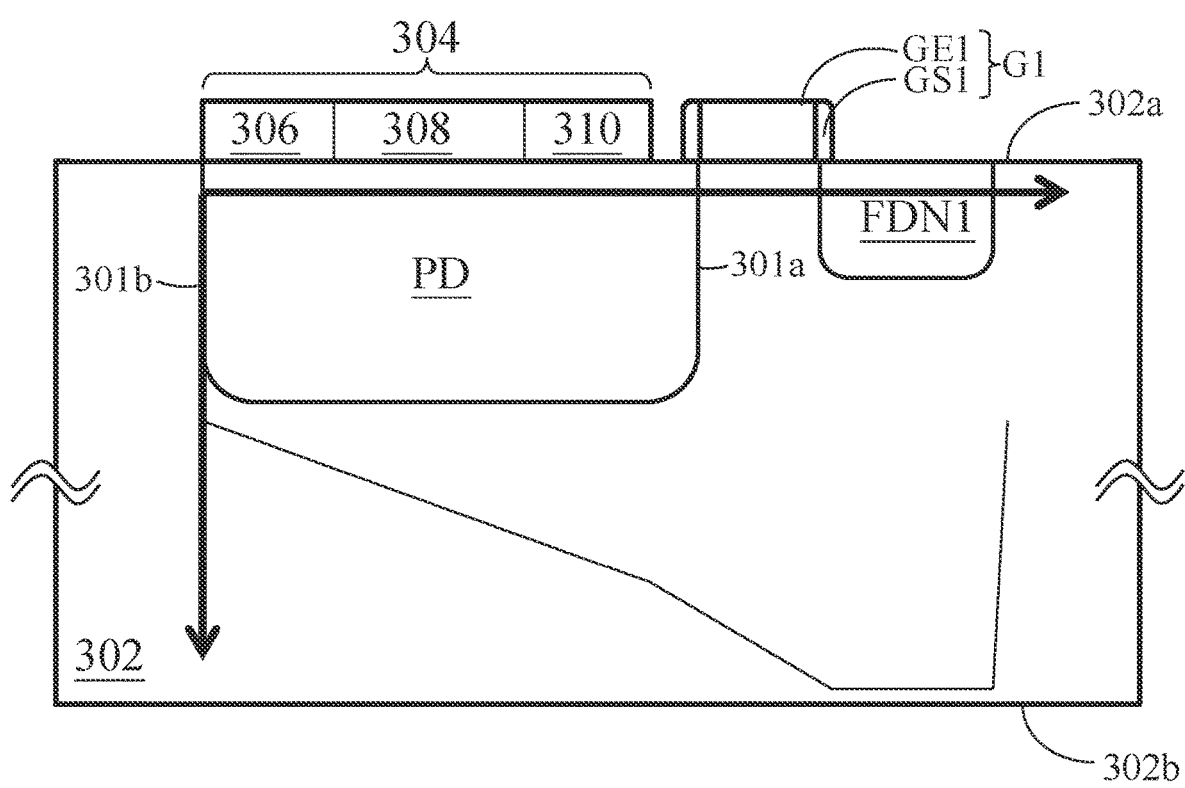
FIG. 6 is an electrical potential diagram of a light sensor when a time-of-flight distance measuring system operates under the sampling operation.

FIG. 6 is an electrical potential diagram of the light sensor 302 when the TOF distance measuring system 100 is operating under a sampling operation. As shown in FIG. 6, the switch MT1 is conducted (i.e., the first charge output signal TX1 is at high voltage), and hence, the electrical potential barrier between the photodiode PD and the first floating diffusion region FDN1 disappears, and the charges flows from the photodiode PD into the first floating diffusion region FDN1.

In the present embodiment, even the overall N-type doping concentration in the photodiode PD is uniform, it is still possible to rely solely on the electric field created by the diode 304 in the photodiode PD to make the charge in the photodiode PD move faster from the second terminal 301b to the first terminal 301a. Since the TOF distance measuring system 100 is based on estimating the time-of-flight of light to derive the distance reversely, if the charge in the photodiode PD is not fast enough, the estimated flight time of the light is longer than the actual one, thereby causing errors. Therefore, the present application makes the charge in the photodiode PD move faster from the second terminal 301b to the first terminal 301a, which may improve the accuracy of the TOF distance measuring system 100. Further, the reverse-biased diode 304 has a little leakage current, so it will not increase the power consumption too much in order to create an electric field in the photodiode PD. While the present application does not limit the extent that the diode 304 overlaps with the photodiode PD, it is understood that the greater the extent of the diode 304 overlapping the photodiode PD, the more controllable the formation of electric fields in the photodiode PD.

However, in certain embodiments, the overall N-type doping concentration in the photodiode PD may be non-uniform. For example, the N-type doping concentration may increase from the second terminal 301b to the first terminal 301a so as to create a greater electrical potential difference between the second terminal 301b and the first terminal 301a of the photodiode PD, thereby further improving the speed that the charges move from the second terminal 301b to the first terminal 301a.

Figure 7:
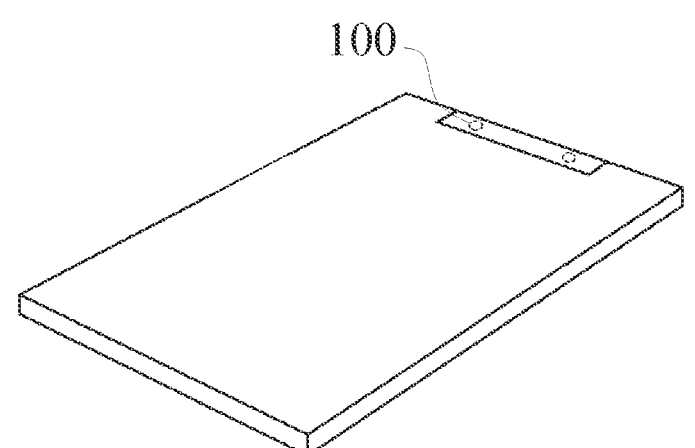
FIG. 7 is a schematic diagram illustrating an electronic device according to an embodiment of the present application.

FIG. 7 is a schematic diagram illustrating an electronic device according to embodiments of the present application. The electronic device 400 is configured to perform distance measuring, wherein the electronic device 400 includes the light sensor 103 or the TOF distance measuring system 100. In this embodiment, the electronic device 400 may be any electronic device, such as a smartphone, a personal digital assistant, a hand-held-computing system, a tablet computer or any electronic devices.

What is claimed is:

1. A light sensor, comprising a semiconductor substrate and a pixel array disposed on the semiconductor substrate, wherein the pixel array comprises a plurality of pixels, and the semiconductor substrate comprises a first surface and a second surface opposite to the first surface, wherein each of the pixels comprises:

a photodiode, disposed at the semiconductor substrate and adjacent to the first surface, and configured to sense light to generate charges;

a first floating diffusion region and a second floating diffusion region, disposed in the semiconductor substrate and adjacent to the first surface, and configured to collect the charges during a sampling operation;

a third floating diffusion region, disposed in the semiconductor substrate and adjacent to the first surface, and configured to collect the charges during a reset operation;

a first gate, a second gate, and a third gate, disposed on the semiconductor substrate, and configured to selectively control the charges to enter the first floating diffusion region, the second floating diffusion region, and the third floating diffusion region, respectively, wherein each of the first gate, the second gate, and the third gate comprises a side-wall spacer, wherein the third gate is disposed between the first gate and the second gate, and the third floating diffusion region is disposed between the first floating diffusion region and the second floating diffusion region; and a PIN diode, disposed on the photodiode, wherein the photodiode has a first terminal and a second terminal, wherein the first terminal faces the first floating diffusion region, and the second terminal faces away from the first floating diffusion region;

the PIN diode at least partially overlaps with the photodiode as viewed from the first surface of the semiconductor substrate to the second surface, in a first direction perpendicular to the first surface;

as viewed from the first surface of the semiconductor substrate to the second surface in the first direction, the first floating diffusion region, the third floating diffusion region, and the second floating diffusion region are sequentially arranged in a second direction and separated from the first terminal of the photodiode in a third direction, wherein the first direction, the second direction, and the third direction are perpendicular to each other; and the PIN diode comprises an N-type region, an intrinsic region, and a P-type region sequentially arranged in the third direction, wherein the N-type region is closer to the first floating diffusion region than the P-type region is, wherein the N-type region is spaced apart from the first terminal of the photodiode in the third direction, as viewed from the first surface of the semiconductor substrate to the second surface in the first direction.

2. The light sensor of claim 1, wherein the PIN diode is made of polysilicon material.

3. The light sensor of claim 1, wherein the PIN diode overlaps with the second terminal of the photodiode.

4. The light sensor of claim 3, wherein the P-type region of the PIN diode is closer to the second terminal of the photodiode than the N-type region is, and the N-type region of the PIN diode is closer to the first terminal of the photodiode than the P-type region is.

5. The light sensor of claim 1, wherein during the sampling operation, the first gate is coupled to a first bias voltage, and when it is not during the sampling operation, the first gate is coupled to a second bias voltage, wherein the first bias voltage is higher than the second bias voltage.

6. The light sensor of claim 1, wherein the photodiode has a uniform doping concentration.

7. The light sensor of claim 1, wherein a doping concentration of the photodiode increases from the second terminal to the first terminal.

8. The light sensor of claim 1, further comprising a dielectric layer, wherein the dielectric layer is disposed between the PIN diode and the photodiode.

9. The light sensor of claim 1, wherein the PIN diode has a first width in the second direction, the photodiode has a second width in the second direction, wherein the first width is greater than the second width, as viewed from the first surface of the semiconductor substrate to the second surface in the first direction.

10. A time-of-flight distance measuring system, comprising:

a light pulse generating unit, configured to generate a light pulse signal;

a light sensor, configured to receive the light pulse signal reflected from a target and generate a corresponding light sensing signal, wherein the light sensor comprises a semiconductor substrate and a pixel array disposed on the semiconductor substrate, wherein the pixel array comprises a plurality of pixels, and the semiconductor substrate comprises a first surface and a second surface opposite to the first surface, wherein each of the pixels comprises:

a photodiode, disposed at the semiconductor substrate and adjacent to the first surface, and configured to sense light to generate charges;

a first floating diffusion region and a second floating diffusion region, disposed in the semiconductor substrate and adjacent to the first surface, and configured to collect the charges during a sampling operation;

a third floating diffusion region, disposed in the semiconductor substrate and adjacent to the first surface, and configured to collect the charges during a reset operation;

a first gate, a second gate, and a third gate, disposed on the semiconductor substrate, and configured to selectively control the charges to enter the first floating diffusion region, the second floating diffusion region, and the third floating diffusion region, respectively, wherein each of the first gate, the second gate, and the third gate comprises a side-wall spacer, wherein the third gate is disposed between the first gate and the second gate, and the third floating diffusion region is disposed between the first floating diffusion region and the second floating diffusion region; and a PIN diode, disposed on the photodiode;

wherein the photodiode has a first terminal and a second terminal, wherein the first terminal faces the first floating diffusion region, and the second terminal faces away from the first floating diffusion region;

the PIN diode at least partially overlaps with the photodiode as viewed from the first surface of the semiconductor substrate to the second surface, in a first direction perpendicular to the first surface; and as viewed from the first surface of the semiconductor substrate to the second surface in the first direction, the first floating diffusion region, the third floating diffusion region, and the second floating diffusion region are arranged in a second direction and separated from the first terminal of the photodiode in a third direction, wherein the first direction, the second direction, and the third direction are perpendicular to each other;

the PIN diode comprises an N-type region, an intrinsic region, and a P-type region sequentially arranged in the third direction, wherein the N-type region is closer to the first floating diffusion region than the P-type region is, wherein the N-type region is spaced apart from the first terminal of the photodiode in the third direction, as viewed from the first surface of the semiconductor substrate to the second surface in the first direction;

and a processing unit, configured to calculate a distance between the system to the target according to the light sensing signal.

11. The time-of-flight distance measuring system of claim 10, wherein the PIN diode is made of polysilicon material.

12. The time-of-flight distance measuring system of claim 10, wherein the PIN diode overlaps with the second terminal of the photodiode.

13. The time-of-flight distance measuring system of claim 10, wherein the P-type region of the PIN diode is closer to the second terminal of the photodiode than the N-type region is, and the N-type region of the PIN diode is closer to the first terminal of the photodiode than the P-type region is.

14. The time-of-flight distance measuring system of claim 10, wherein a doping concentration of the photodiode increases from the second terminal to the first terminal.

\* \* \* \* \*